(12) United States Patent
Suzuki et al.

(10) Patent No.: US 6,228,166 B1
(45) Date of Patent: May 8, 2001

(54) METHOD FOR BORON CONTAMINATION REDUCTION IN IC FABRICATION

(75) Inventors: Tatsuya Suzuki; Tohru Aoyama, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 08/974,990

(22) Filed: Nov. 20, 1997

(30) Foreign Application Priority Data

Nov. 20, 1996 (JP) .................................................... 8-308842

(51) Int. Cl.$^7$ .................................................... C08B 23/02
(52) U.S. Cl. ............................ 117/94; 117/935; 117/939; 216/2
(58) Field of Search ............................. 117/94, 935, 939; 216/2

(56) References Cited

U.S. PATENT DOCUMENTS

| 4,030,949 | * | 6/1977 | Horikoshi | 438/41 |
| 4,339,340 | * | 7/1982 | Muraoka . | |
| 4,946,547 | * | 8/1990 | Palmour | 117/97 |
| 5,129,958 | | 7/1992 | Nagashima et al. | 134/22.1 |

FOREIGN PATENT DOCUMENTS

| 1093412 | 4/1989 | (JP) . |
| 4-97517 | 3/1992 | (JP) . |

OTHER PUBLICATIONS

Stolk, P.A., "Trap–limited interstitial diffusion and enhanced boron clustering in silicon", *Appl. Phys. Lett.*, American Institute of Physics, 66 (5), Jan. 30, 1995, pp. 568–570.
Caymax M R et al:"Optimization of Si–wafer cleaning and the use of buffer–layers for epitaxial growth of SiGe–layes by VLPCVD at T=60 C"Mater.Res. Soc. Apr. 27–29, 1992 pp. 461–466.

Stevie F A et, al. "Boron Contamination of surfaces in silicon microelectronics processing: Characterization and causes" Journal of Vacuum Science & Technology Sep.–Oct. 1991 vol. 9 No. 5 pp.2813–2816.

Hashimoto T et, al. "Boron spike effect on cut–off frequency and early voltage in SiGe HBTs"Proceedings of the 25$^{th}$ European solid state device research conference Sep. 25–27 1995 pp. 501–504.

Iyer S S et, al. "Origin and reduction of interfacial boron spikes in silicon molecular beam epitaxy" Applied Physics Letters vol..52, No. 6 Feb. 8, 1988 pp. 486–488.

\* cited by examiner

*Primary Examiner*—David W. Wu
*Assistant Examiner*—Ling-Siu Chol
(74) *Attorney, Agent, or Firm*—Hutchins, Wheeler & Dittmar

(57) ABSTRACT

In order to reduce boron concentration between a silicon substrate and an Si or $Si_{1-x}Ge_x$ layer which is epitaxially grown in a CVD (chemical vapor deposition) apparatus, the silicon substrate is pretreated, before being loaded into the CVD apparatus, such as to prevent the substrate from being contaminated by boron in a clean room. Further, in accordance with one embodiment, a CVD growth chamber itself is cleaned, before the substrate is loaded into the growth chamber, using an $F_2$ gas at a predetermined temperature of the substrate, thereby to remove boron residues in the growth chamber.

24 Claims, 14 Drawing Sheets

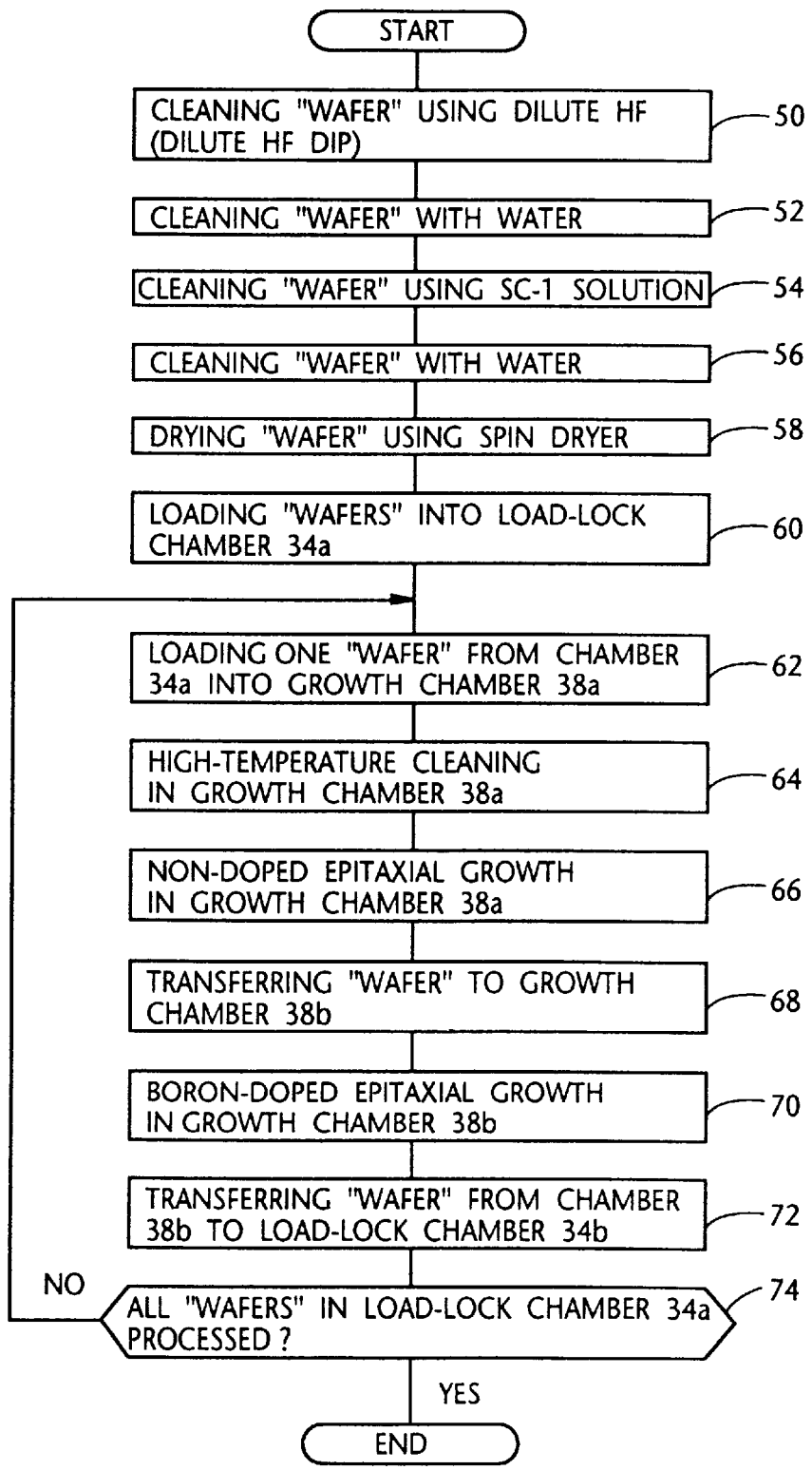

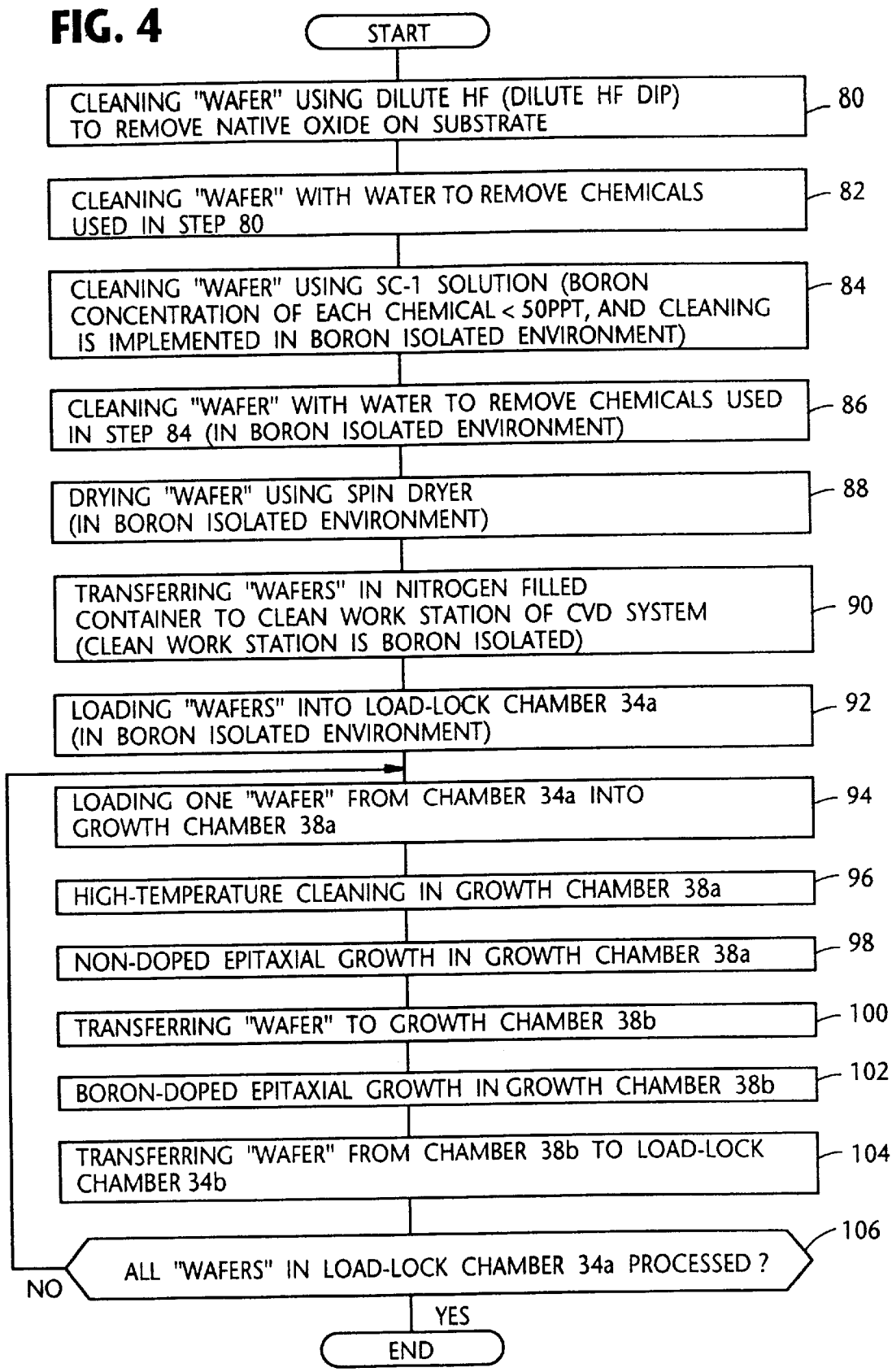

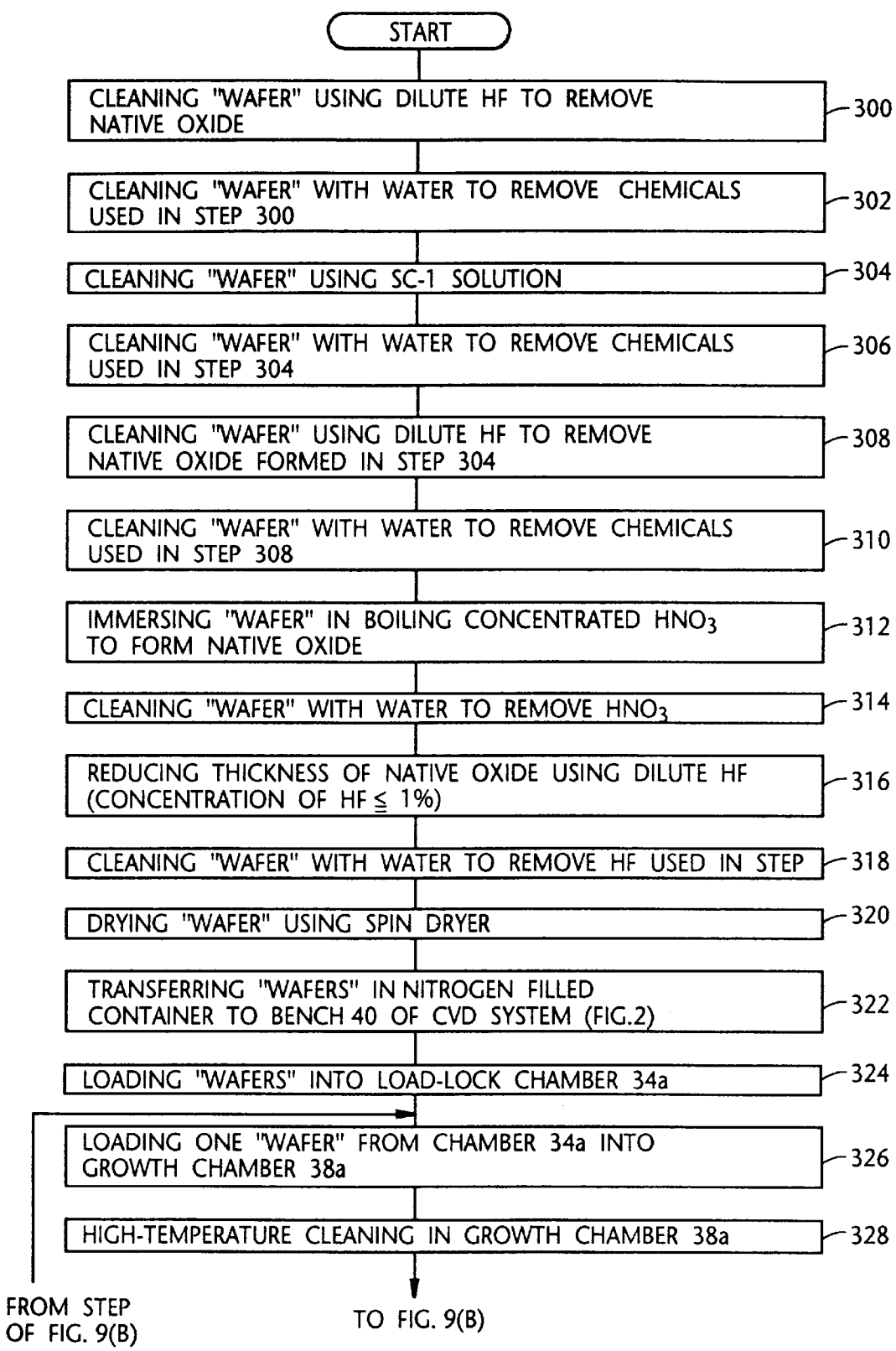

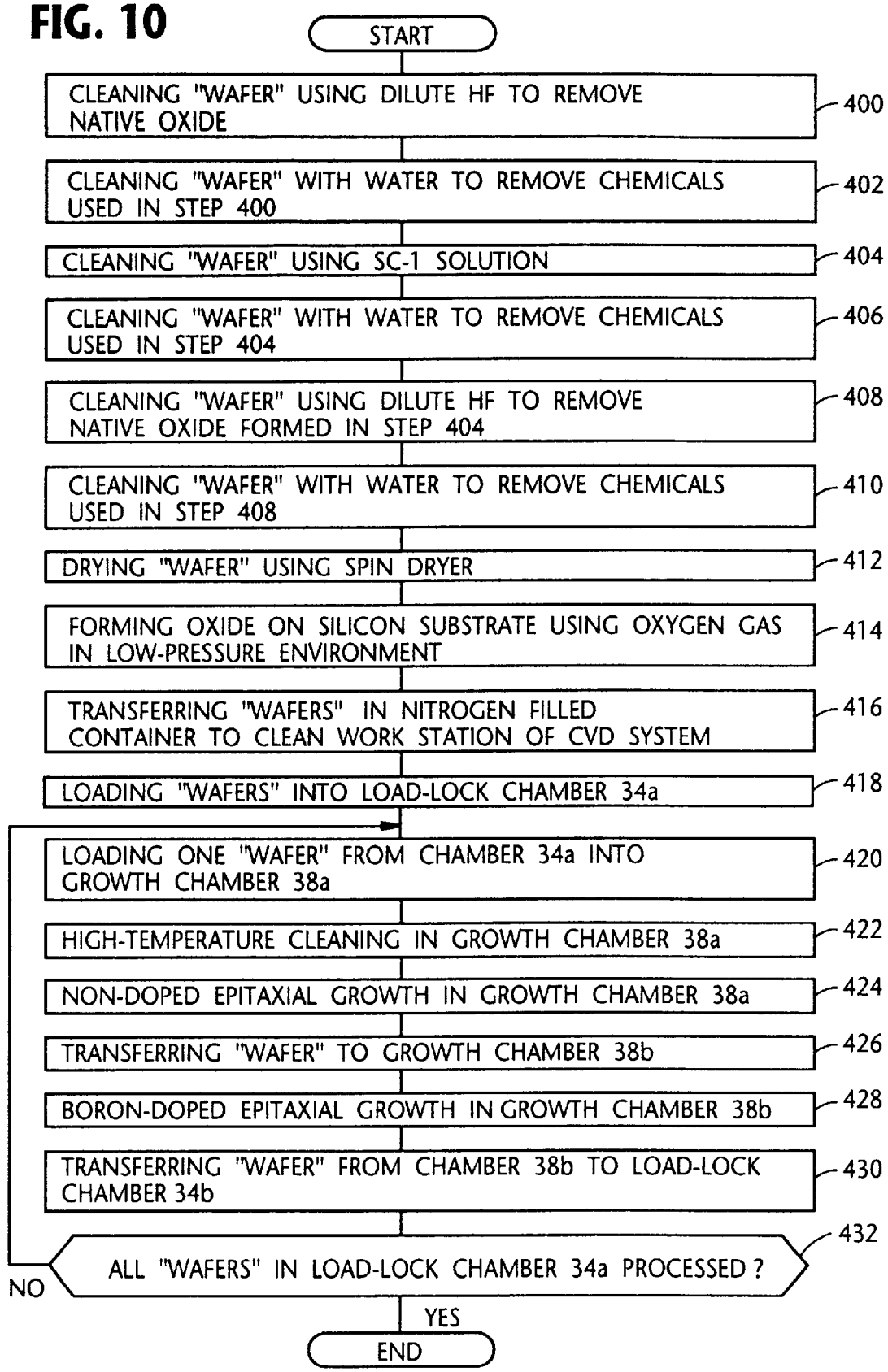

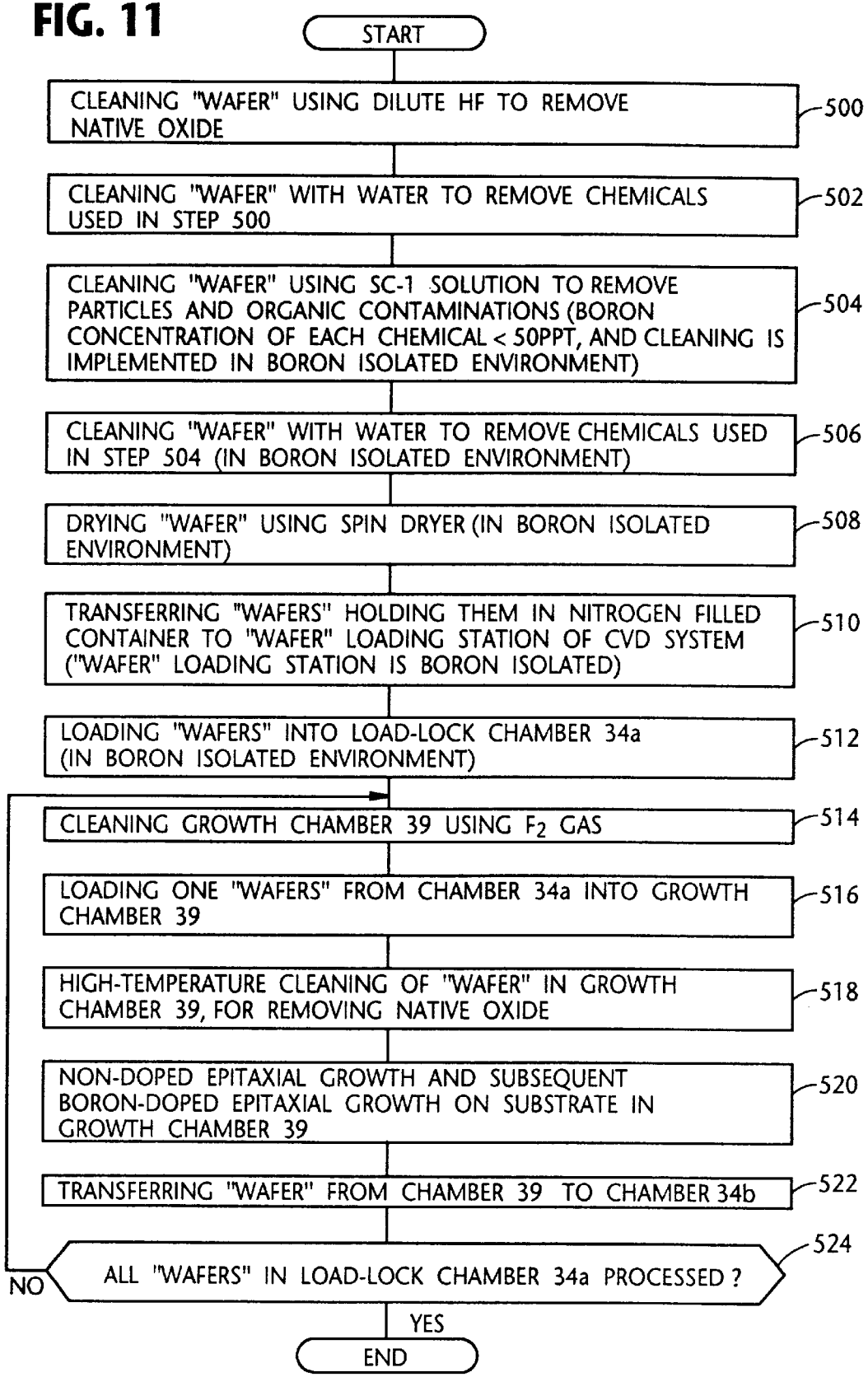

METHOD FOR BORON CONTAMINATION REDUCTION IN IC FABRICATION

BACKGROUND OF THE INVENTION

1. Field of the Invention

The present invention relates generally to semiconductor device fabrication techniques using ULSI (ultra-large-scale integration) technology, and more specifically to a method of effectively lowering boron (B) concentration at an interface between an epitaxially grown film and the Si substrate surface. Such a film may be a Si or $Si_{1-x}Ge_x$ film selectively deposited in an UHV-CVD (ultrahigh vacuum/chemical vapor deposition) apparatus using a source gas(es) such as $SiH_4$, $Si_2H_6$, $GeH_4$, etc.

2. Description of the Related Art

It is known in the art that the selective epitaxial growth of Si or $Si_{1-x}Ge_x$ on a silicon wafer surface, using an UHV-CVD apparatus with a source gas(es) such as $SiH_4$, $Si_2H_6$, or $GeH_4$, has found an extensive application in forming about 0.1 μm level of channel epitaxial construction in a miniaturized MOS (metal-oxide semiconductor) transistors, next generation's high-speed bipolar transistors, etc.

Before turning to the present invention, it is deemed advantageous to describe, with reference to FIGS. 1(A)–1(C), 2, and 3, conventional techniques relating to the present invention. Throughout the instant disclosure, term "substrate" is interchangeably used with "wafer". Although a high-speed bipolar transistor is referred to in this specification, it should be noted that the present invention is in no way limited thereto.

FIGS. 1(A)–1(C) are schematic cross-sectional views depicting the fabrication of a high-speed NPN bipolar transistor. In brief, a substrate wherein a collector portion has been formed as shown in FIG. 1(A), is transferred to an UHV-CVD apparatus such as that is schematically shown in FIG. 2. In the UHV-CVD apparatus, a Si or $Si_{1-x}Ge_x$ epitaxial base portion is grown on the substrate as illustrated in FIG. 1(B). Following this, the wafer (or substrate) is removed from the UHV-CVD apparatus and an emitter portion is formed on the substrate in the manner shown in FIG. 1(C).

The present invention is directed to effective reduction of boron contamination (or concentration) at an interface between an epitaxially grown film and the Si substrate surface. To this end, each wafer is pretreated before being loaded into the CVD apparatus, and/or a growth chamber of the CVD apparatus is cleaned prior to each CVD process. Thus, it will be understood that the formation of the emitter portion shown in FIG. 1(C) is not relevant to the present invention.

Referring to FIG. 1(A), an $N^+$ layer 10 is grown on an $P^+$<100>-oriented Si substrate 12 with resistivity ranging from 10 to 20 Ωcm (for example). Following this, an $N^-$ epi-layer 14, which functions as a collector, is deposited on the $N^+$ layer 10. Further, as illustrated in FIG. 1(A), a $SiO_2$ layer 16, a $P^+$ poly-Si layer 18, and another $SiO_2$ layer 20 are successively formed using conventional lithography and etching techniques.

The substrate, which has undergone the above processes, is transferred to the UHV-CVD apparatus wherein the Si or $Si_{1-x}Ge_x$ epitaxial base (denoted by numeral 22) is selectively grown on the $N^-$ epi-layer 14. In this case, inner portions of the poly-Si layer 18 grow downwardly as schematically shown in FIG. 1(B). Subsequently, the substrate shown in FIG. 1(B) is unloaded from the UHV-CVD apparatus, after which a $SiO_2$ layer 24 and an $N^+$ poly-Si emitter layer 26 are formed, as shown in FIG. 1(C), using conventional techniques. The processes for forming the structure shown in FIGS. 1(A)–1(C) are well known and not directly concerned with the present invention, and thus further description thereof will be omitted for brevity.

FIG. 2 is a diagram schematically showing one example of an UHV-CVD apparatus (denoted by numeral 30), which comprises a robotic transfer section 32, two load-lock chambers 34a and 34b, another robotic transfer section 36, and two growth chambers 38a and 38b. The UHV-CVD apparatus 30 per se is well known in the art. Other sections such as turbo pumps, which are irrelevant to the present invention, are not shown in FIG. 2 for the sake of simplifying the disclosure. FIG. 2 will also be referred to in the preferred embodiments of the present invention.

The robotic transfer section 32 comprises a clean bench 40 and two substrate transfer robots 42a and 42b, while the robotic transfer section 36 includes a similar substrate transfer robot 44.

Each of the substrates or wafers, which has been processed as shown in FIG. 1(A), is cleaned and then disposed in a substrate carry box 46a which is, in this case, positioned in a place other than on the clean bench 40. This box 46a is then transported to the clean bench 40, as illustrated in FIG. 2. The precleaned wafers contained in the box 46s are loaded on a one-by-one basis, using the robot 42a, into the load-lock chamber 34a. After all the wafers in the box 46a are loaded into the load-lock chamber 34a, the chamber 34a is pumped down to a predetermined pressure. Once the predetermined pressure is reached, the first wafer in the load-lock chamber 34a is introduced, by way of the robot 44, into the growth chamber 38a which is dedicated to non-doping epitaxial growth.

After the epitaxial growth is completed in the chamber 38a, the wafer is conveyed to another growth chamber 38b which is dedicated to p-type (viz., B) doping epitaxial growth. The reason why the two growth chambers 38a and 38b are used will be described later. When the film deposition on the wafer at the chamber 38b is finished, the wafer is transferred to the load-lock chamber 34b. These processes are repeated with each of the wafers stored in the load-lock chamber 34a. When all the wafers in the load-lock chamber 34a are processed and loaded into the other load-lock chamber 34b, they are placed into another substrate carry box 46b by the robot 42b. The wafers in the box 46b are then transported to the next wafer process station, wherein subsequent wafer treatments, such as referred to with respect to FIG. 1(C), are implemented.

FIG. 3 is a flow chart depicting the steps that characterize the conventional processes which include cleaning and CVD processes. In more specific terms, the Si wafers, on which layers or films shown in FIG. 1(A) are formed, are precleaned and then transferred to the UHV-CVD apparatus 30 shown in FIG. 2.

Referring to FIG. 3, at step 50, each Si wafer undergoes a dilute HF (hydrofluoric acid) dip in order to remove native oxide formed on the wafer, after which the chemicals used in step 50 are removed by water washing (step 52). Immediately thereafter, at step 54, the wafer is subjected to a well known RCA cleaning process using a cleaning solution, $NH_4OH$ (ammonia)-$H_2O_2$ (hydrogen peroxide)-$H_2O$ (pure water), thereby removing particles and organic contaminations on the wafer. The cleaning with the aforesaid solution is called "standard cleaning 1 (SC-1)), at $NH_4OH$—$H_2O_2$—$H_2O$ (=1:1.5) (for example) at 60 to 80° C. for 3 to 10 minutes. Following this, at step 56, the reagents used in step 54 are washed away using pure water, and the wafer is then dried using a spin dryer (step 58). The above mentioned wafer cleaning is carried out with each of a predetermined number of the wafers. Subsequently, the precleaned Si wafers are accommodated in the box 46a (FIG. 2) and transported to the clean bench 40 of the UHV-CVD apparatus 30 (FIG. 2).

The Si wafers in the wafer carry box 46a are then successively loaded into the load-lock chamber 34a (step 60). At step 62, a first wafer in the load-lock chamber 34a is loaded into the growth chamber 38a by way of the wafer transfer robot 44. When the first wafer is placed in the growth chamber 38a, the chamber is pumped down to a pressure of $10^{-9}$ to $10^{-10}$ torr. At step 64, the wafer is subjected to a high-temperature treatment (viz., high-temperature flashing) in the growth chamber 38a at more than 900° C. for about 5 minutes in order to remove the native oxide on the wafer. At step 66, a temperature of the wafer is lowered to 600–800° C., after which selective Si or $Si_{1-x}Ge_x$ non-doped epitaxial growth is carried out on the wafer using a source gas(es) selected among $SiH_4$, $Si_2H_6$, $GeH_4$, etc. as is well known in the art.

Subsequently, the flow proceeds to step 68 whereat the wafer is transferred to the growth chamber 38b. At step 70, a boron-doped selective Si or $Si_{1-x}Ge_x$ epitaxial growth is implemented on the wafer, wherein diborane ($B_2H_6$) is used as a dopant gas for forming a p-type base layer. In the above, the wafer is transferred from the chamber 38a to the chamber 38b in a vacuum environment thus obviating the need for implementing the high-temperature flashing on the wafer in the growth chamber 38b. At step 72, the wafer on which the p-type base layer has been grown is loaded into the load-lock chamber 34b. Thereafter, the next wafer in the load-lock chamber 34a is introduced into the growth chamber 38a from the load-lock chamber 34a and is subjected to the above mentioned processes. At step 74, a check is made to determine if all the wafers in the load-lock chamber 34a are processed. If the answer to the inquiry made at step 74 is affirmative (viz., YES), the flow shown in FIG. 3 is terminated.

The above mentioned known wafer processing steps, however, suffer from the problem that the selective Si or $Si_{1-x}Ge_x$ epitaxial growth on the wafer undesirably leaves "boron contamination" at the boundary between the epitaxial layer and the substrate surface. The boron concentration typically exhibits more than 1E17 (i.e., $1\times10^{17}$) atoms/$cm^3$ at peak concentration and 1E12 atoms/$cm^2$ at sheet concentration. The causes of such a high boron concentration are as follows.

(1) Boron is contained in the cleaning solution used in the RCA cleaning process. For example, in the case where the solution is a composition of Ammonia-"Hydrogen Peroxide"-"pure water"=1:1.5, boron in the order of about 100 ppt (parts per trillion) is present in the above-mentioned standard cleaning (SC-1) solution. Thus, when a wafer is subjected to the conventional RCA cleaning, boron is undesirably absorbed into or included in the native oxide.

(2) In the clean room, the filtered air flows from ceiling to floor. Such a filter ceiling system includes a borosilicate glass fiber filter such as ULPA (ultra low penetration air) filter, HEPA (high efficiency particulate air) filter, etc. The descending airflow contains boron resulting from the glass fiber filters. Further, these filters are unable to successfully strain out boron which is contained in the outside (viz., open) air which is introduced to the clean room. As a result, boron is inherently present in the clean room environment. Thus, the boron concentration in the SC-1 solution is further enhanced with the result of additional boron being taken into the native oxide. Still further, during the steps 50, 52, 56, 58 and 60 (FIG. 3), boron tends to adhere, in the clean room environment, to the native oxide developed on the wafer.

(3) Boron which is adhered to the native oxide remains on the wafer even if the native oxide is removed by the high-temperature flashing in the growth chamber.

The above mentioned high boron concentration at the interface between the epitaxial layer and the surface of the Si wafer, undesirably lowers a cut-off frequency of a high-speed bipolar transistor, and causes variation of the threshold voltage in the case of miniaturized CMOS transistors.

One approach to reducing the boron contamination is disclosed in Japanese Laid-open Patent Application No. 4-97517. According to this prior art, a wafer which has been subjected to the RCA cleaning is treated using dilute HF and then cleaned using water whereby boron is removed as $BF_3$. The prior art, however, has encountered the difficulty that the surface of the wafer is exposed to an ambient clean room atmosphere and thus, the wafer is susceptible to organic and/or inorganic contamination which cannot be removed even by the high-temperature flashing in the growth chamber.

SUMMARY OF THE INVENTION

It is therefore an object of the present to effectively reduce boron concentration between a silicon substrate and a Si or $Si_{1-x}Ge_x$ layer which is epitaxially grown in a CVD (chemical vapor deposition) apparatus.

One aspect of the present invention resides in a method of reducing boron concentration between a silicon substrate and an Si or $Si_{1-x}Ge_x$ layer which is epitaxially grown in a CVD (chemical vapor deposition) apparatus, comprising the steps of: (a) cleaning the substrate using a solution including a plurality of chemicals each of which contains boron whose concentration is less than 50 ppt, the cleaning being implemented before the substrate is loaded into the CVD apparatus; and (b) processing the substrate in a boron-free isolated environment at step (a) and before the substrate is loaded into the CVD apparatus.

Another aspect of the present invention resides in a method of reducing boron concentration between a silicon substrate and an Si or $Si_{1-x}Ge_x$ layer which is epitaxially grown in a CVD (chemical vapor deposition) apparatus, comprising the steps of: (a) ion implanting silicon atoms into the substrate before the substrate is loaded into the CVD apparatus; (b) cleaning the substrate using a solution including $H_2O_2$ before the substrate is loaded into the CVD apparatus; and (c) implementing a high-temperature treatment on the substrate in the CVD apparatus thereby diffusing boron, adhered to the substrate, into the substrate.

Still another aspect of the present invention resides in a method of reducing boron concentration between a silicon substrate and an Si or $Si_{1-x}Ge_x$ layer which is epitaxially grown in a CVD (chemical vapor deposition) apparatus, comprising the steps of: (a) cleaning the substrate using a solution including $H_2O_2$ before the substrate is loaded into the CVD apparatus; (b) removing native oxide produced on the substrate at step (a) using a dilute HF before the substrate is loaded into the CVD apparatus; (c) immersing the substrate in boiling concentrated $HNO_3$ to form native oxide on the substrate, the immersing of the substrate being implemented before the substrate is loaded into the CVD apparatus; and (d) implementing a high-temperature treatment on the substrate in the CVD apparatus to diffuse boron, adhered to the substrate, into the substrate.

Still another aspect of the present invention resides in a method of reducing boron concentration between a silicon substrate and an Si or $Si_{1-x}Ge_x$ layer which is epitaxially grown in a CVD (chemical vapor deposition) apparatus, comprising the steps of: (a) cleaning the substrate using a solution including $H_2O_2$ before the substrate is loaded into the CVD apparatus; (b) removing native oxide produced on the substrate at step (a) using a dilute HF before the substrate is loaded into the CVD apparatus; (c) growing thermally oxide on the substrate using an oxygen gas in a low-pressure atmosphere before the substrate is loaded into the CVD apparatus; and (d) implementing a high-temperature treatment on the substrate in the CVD apparatus to remove the oxide which has thermally been grown on the substrate at step (c).

Still another aspect of the present invention resides in a method of reducing boron concentration between a silicon substrate and an Si or $Si_{1-x}Ge_x$ layer which is epitaxially grown in a CVD (chemical vapor deposition) apparatus, comprising the steps of: (a) cleaning a CVD growth chamber, before the substrate is loaded into the growth chamber, using an $F_2$ gas at a predetermined temperature of the substrate, thereby to remove boron residues in the growth chamber; (b) implementing a high-temperature treatment on the substrate loaded into the growth chamber to remove native oxide on the substrate; and (c) implementing sequentially non-doped and boron-doped epitaxial growths on the substrate in the growth chamber.

BRIEF DESCRIPTION OF THE DRAWINGS

The features and advantages of the present invention will become more clearly appreciated from the following description taken in conjunction with the accompanying drawings in which like elements are denoted by like reference numerals and in which:

FIG. 3 is a flow chart which includes steps of part of bipolar transistor fabrication;

FIG. 4 is a flow chart which includes steps which characterize the first embodiment of the present invention;

FIGS. 9(A) and 9(B) are each showing a flow chart which includes steps which characterize the third embodiment of the present invention;

FIG. 10 is a flow chart which includes steps which characterize the fourth embodiment of the present invention;

FIG. 11 is a flow chart which includes steps which characterize the fifth embodiment of the present invention;

DETAILED DESCRIPTION OF THE PREFERRED EMBODIMENTS

A first embodiment of the present invention will be described with reference to FIGS. 4–6.

Figure 1A:
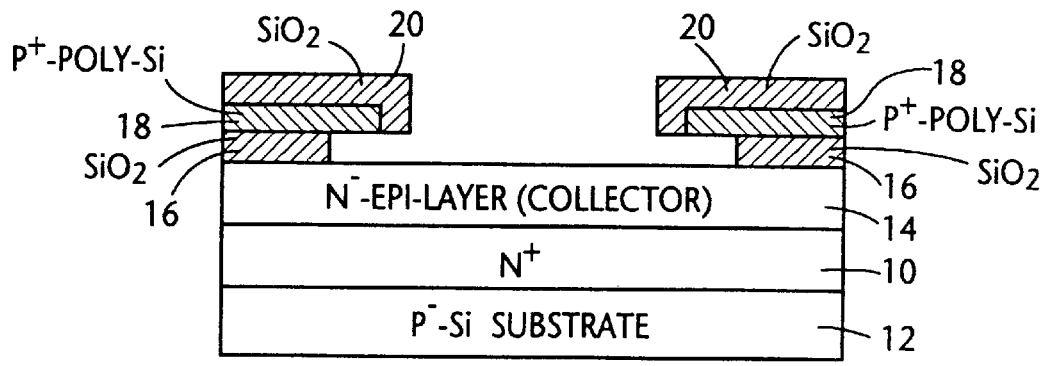
FIGS. 1(A) to 1(C) are cross-sectional views each showing film depositions while forming a high-speed bipolar transistor, having referred to in the opening paragraphs of the instant disclosure.
Figure 2:
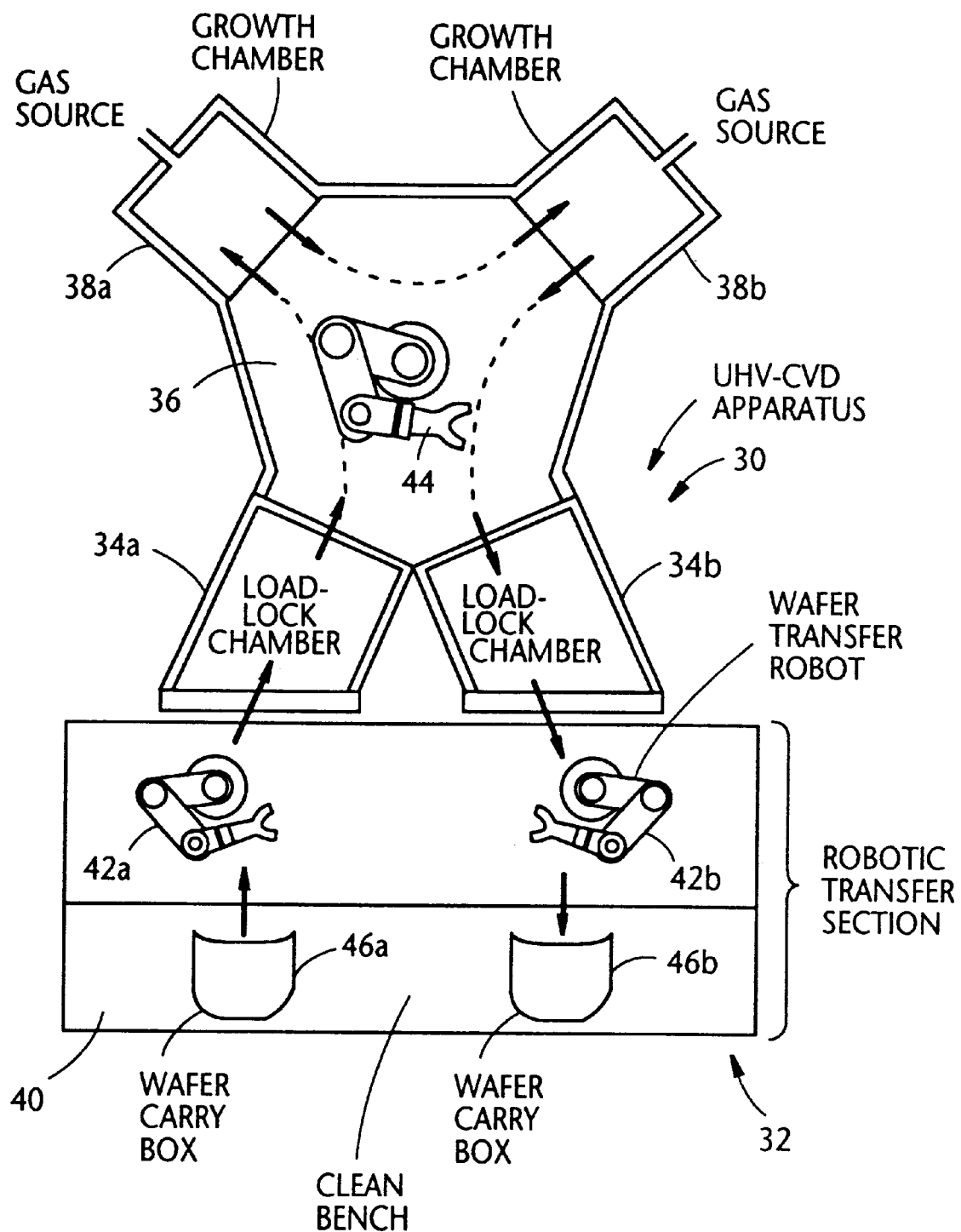
FIG. 2 is a diagram showing a conventional UHV-CVD apparatus.
Figure 6:
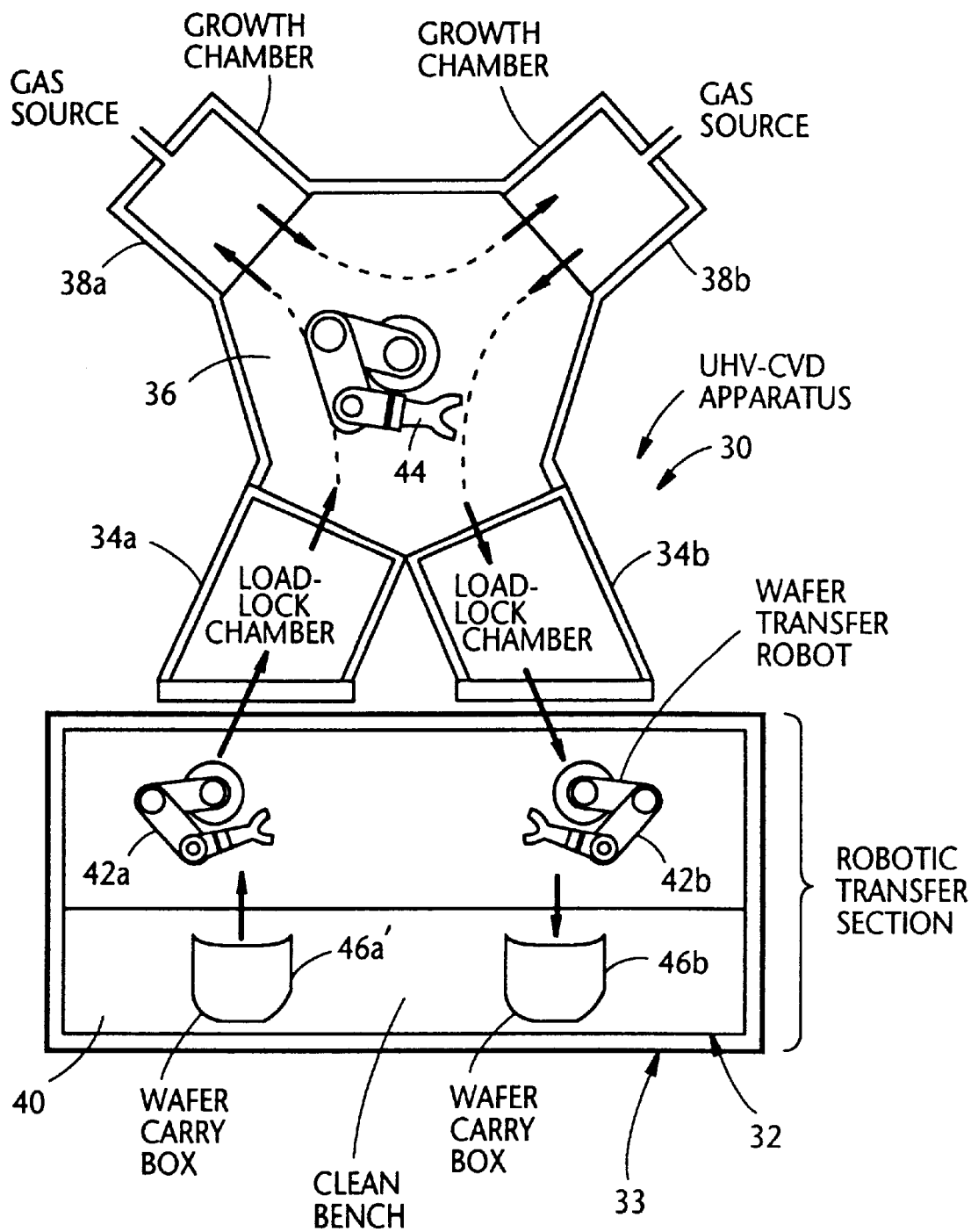
FIG. 6 is a diagram showing a conventional UHV-CVD which is equipped with a clean work station according to the present invention.

In order to simplify the instant disclosure, it is assumed that the silicon substrates (or wafers), on each of which the layers shown in FIG. 1(A) has already been formed, are cleaned and then transferred to an UHV-CVD apparatus (or system) 31 shown in FIG. 6. Further, as mentioned above, a $Si_{1-x}Ge_x$ (or Si) layer is formed on each wafer in the CVD apparatus 31. This CVD apparatus 31 is identical with the apparatus 30 of FIG. 2 except that the robotic transfer system 32 is substantially isolated from the ambient clean room atmosphere. Thus, the portions of FIG. 6, which are identical with those of FIG. 2, are indicated by the same numerals as used in FIG. 2.

As shown in FIG. 4, at step 80, each silicon wafer undergoes dilute HF (hydrofluoric acid) dipping in order to remove native oxide formed on the wafer. Thereafter, the chemicals or reagents used in step 80 are removed by washing each wafer using water (step 82). Steps 80 and 82 are essentially identical with steps 50 and 52 of FIG. 3, respectively. The wafer is then cleaned, without being dried, using "standard cleaning 1 (SC-1) solution" of the RCA cleaning process (viz., $NH_4OH$—$H_2O_2$—$H_2O$— for removing particles and organic contaminants (impurities). The standard cleaning (SC-1) solution is composed of $NH_4OH$—$H_2O_2$—$H_2O$— (typically 1:1:5) in the case and its temperature is maintained at about 70° C. By the way, the solution is also referred to as APM (Ammonia-Hydrogen Peroxide Mixture). It should be noted that boron concentration of each of ammonia ($NH_4OH$), hydrogen peroxide ($H_2O_2$), and pure water is selected to be less than 50 ppt.

Figure 5A:
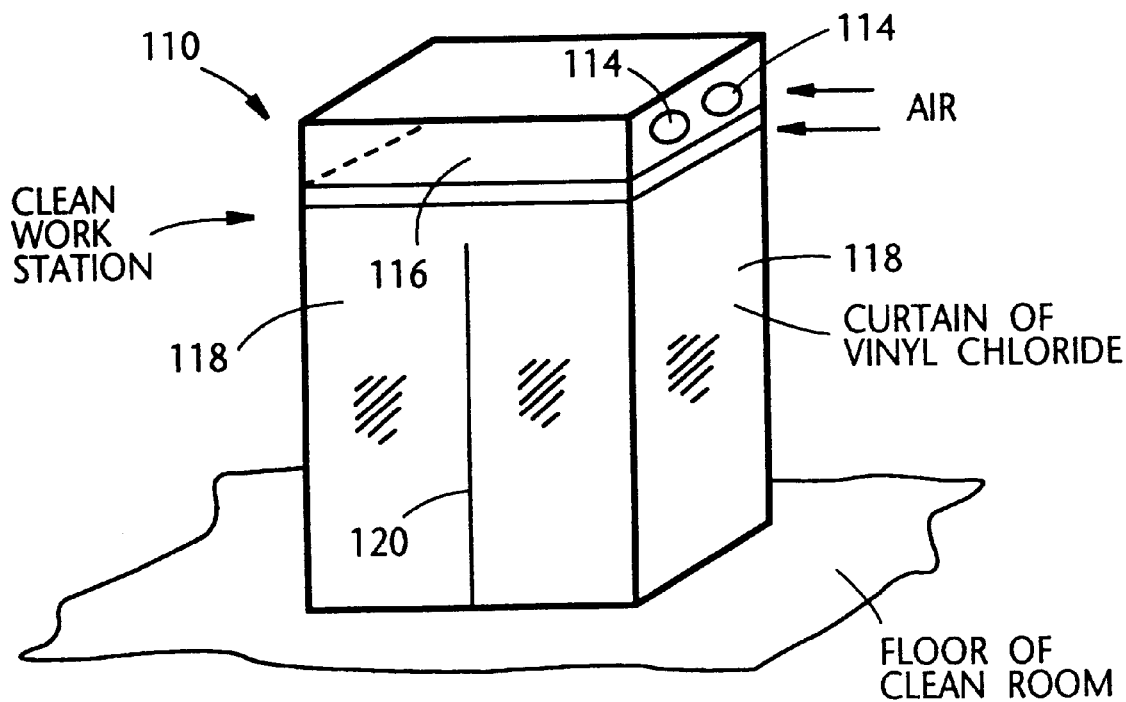
FIGS. 5(A) and 5(B) are each showing a clean work station used in the first embodiment.
Figure 5B:
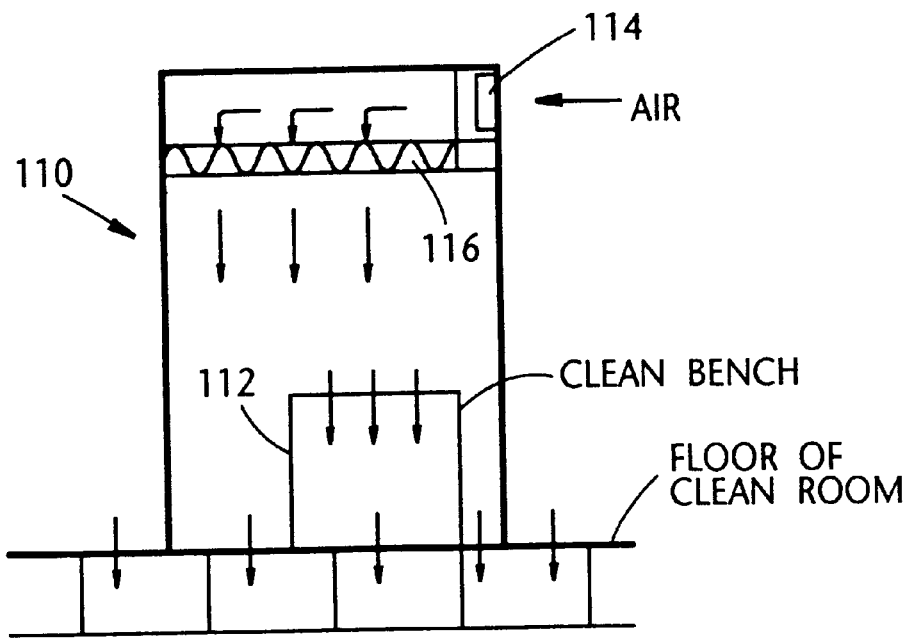

Further, the wafer cleaning using the SC-1 solution is implemented in a clean work station 110 (FIGS. 5(A) and 5(B)) which is provided in a conventional clean room. Reference is now made to FIGS. 5A and 5B, which are respectively a perspective and cross-sectional views of the clean work station 110. In FIG. 5B, arrows indicate air flow. The station 110 is provided with a clean bench 112 therein, on which a container of the SC-1 solution is placed. More specifically, the clean work station 110 is comprised of one or more air intake fans 114 by which air in the clean room is introduced into the station 110. Further, the station 110 includes a chemical filter 116 which has an effective boron adsorptive power. The interior of the clean work station 110 is isolated from the clean room by way of a curtain 118 of vinyl chloride. One side of the curtain 118 is provided with a zipper or slide fastener 120 for the purpose of access to the inside of the station 110.

Returning to FIG. 4, at steps 86 and 88, the wafers are cleaned with water and then dried using a conventional spin dryer. These wafer treatments are carried out on the clean bench 112 within the station 110 shown in FIG. 5B. At step 90, the precleaned wafers are accommodated in a wafer carry box filled with nitrogen and then transferred to the clean bench 40 of the robotic transfer section 32 (FIG. 6). This section 32 is also isolated from the clean room in order to prevent boron traces in the clean room from entering the section 32. That is, the robotic transfer section 32 is provided in a clean work station similar to that shown in FIGS. 5A and 5B, a manner of which is indicated by a bold line 33. In this case, it is necessary to provide openings for loading the wafers into the load-lock chamber 34a and for unloading the wafers into another load-lock chamber 34b. The above mentioned wafer carry box, which is filled with nitrogen, is indicated by 46a' in FIG. 6.

Figure 1B:
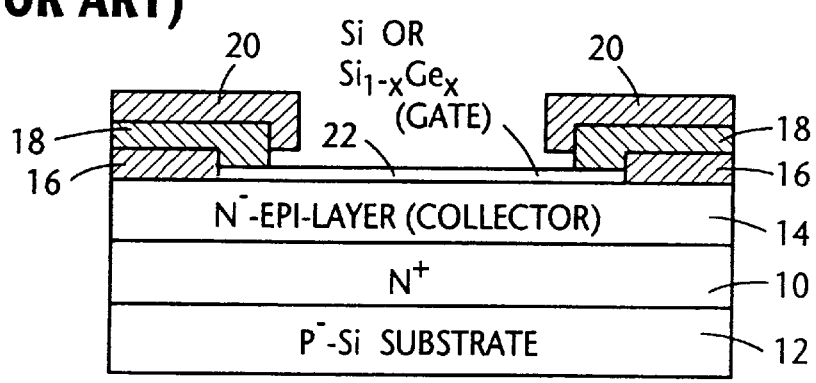
Figure 1C:
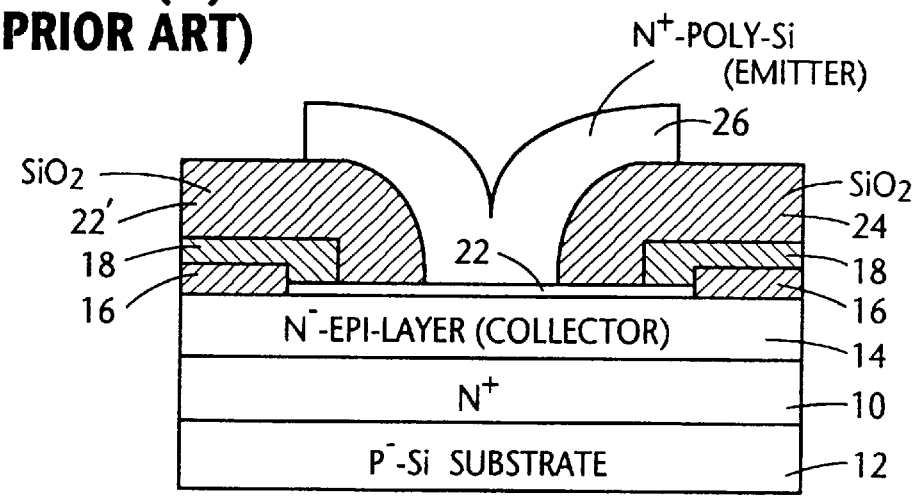

The silicon wafers in the box 46a' are then successively loaded into the load-lock chamber 34a (step 92) in a boron-free isolated environment. At step 94, a first wafer in the load-lock chamber 34a is transferred into the growth chamber 38a by way of the wafer transfer robot 44. When the first wafer is placed in the growth chamber 38a, the chamber 38a is pumped down to a pressure of $10^{-9}$ to $10^{-10}$ torr (for example). At step 96, the temperature of the wafer is raised to about 950° C. and undergoes a high-temperature treatment (viz., high-temperature flashing) for about 5 minutes in order to remove native oxide on the wafer. Immediately after the high-temperature treatment on the wafer is completed, the temperature of the wafer is lowered to about 700° C. At step 98, a non-doped epitaxial Si layer with a thickness of about 2000 angstroms (for example) is selectively grown on the wafer, as shown in FIG. 1B, while flowing a $Si_2H_6$ gas into the chamber 38a at a rate of 10 sccm (standard $cm^3$/min). As an alternative, a non-doped $Si_{1-x}Ge_x$ epitaxial layer may be grown using source gases of $Si_2H_8$ (or $SiH_4$) and $GeH_4$.

Subsequently, at step 100, the wafer is transferred to another growth chamber 38b. At step 102, a boron-doped Si layer is grown on the non-doped layer in the chamber 38b using diborane ($B_2H_6$) as a dopant gas for forming a p-type base layer. In the above, the wafer is transferred from the chamber 38a to the chamber 38b in a vacuum environment and thus, there is no need for implementing the high-temperature flashing in the growth chamber 38b. At step 104, the wafer on which the p-type base layer has been grown is loaded into the load-lock chamber 34b. Thereafter, the next wafer in the load-lock chamber 34a is introduced into the growth chamber 38a from the load-lock chamber 34a and is subjected to the above mentioned processes. At step 106, a check is made to determine if all the wafers in the load-lock chamber 34a are processed. If the answer to the inquiry made at step 106 is affirmative, the flow shown in FIG. 4 is terminated.

According to experiments conducted by the inventors, under the conditions as mentioned above, the peak concentration of born at an interface, between the epitaxial layer and the substrate was 4E16 atoms/$cm^3$. On the other hand, the sheet concentration of boron at the same interface was 1E11 atoms/$cm^2$. On the contrary, in the case where the above mentioned boron isolation in the clean room was not implemented at steps 84, 86, 88, 90, and 92, the peak concentration of boron at the interface was 3E17 atoms/$cm^3$. Further, the sheet concentration of boron at the interface was 1E12 atoms/$cm^2$. These results were obtained using the above-mentioned secondary-ion mass spectroscopic (SIMS) technique and are plotted in FIG. 13.

Further, as the concentration of boron at the interface between the epitaxial layer and the substrate can effectively be reduced, it is expected to be able to improve a cutoff frequency of a bipolar transistor to a considerable extent.

A second embodiment of the present invention will be described with reference to FIGS. 2, 7, 8(A) and 8(B). In the second embodiment, the boron isolating means such as the clean work station 110 of FIGS. 5(A) and 5(B) is not used.

As in the first embodiment, assuming that the silicon substrates (or wafers), on each of which the layers shown in FIG. 1(A) has already been formed, are pretreated and then transferred to an UHV-CVD apparatus (or system) 30 shown in FIG. 2.

Figure 7:
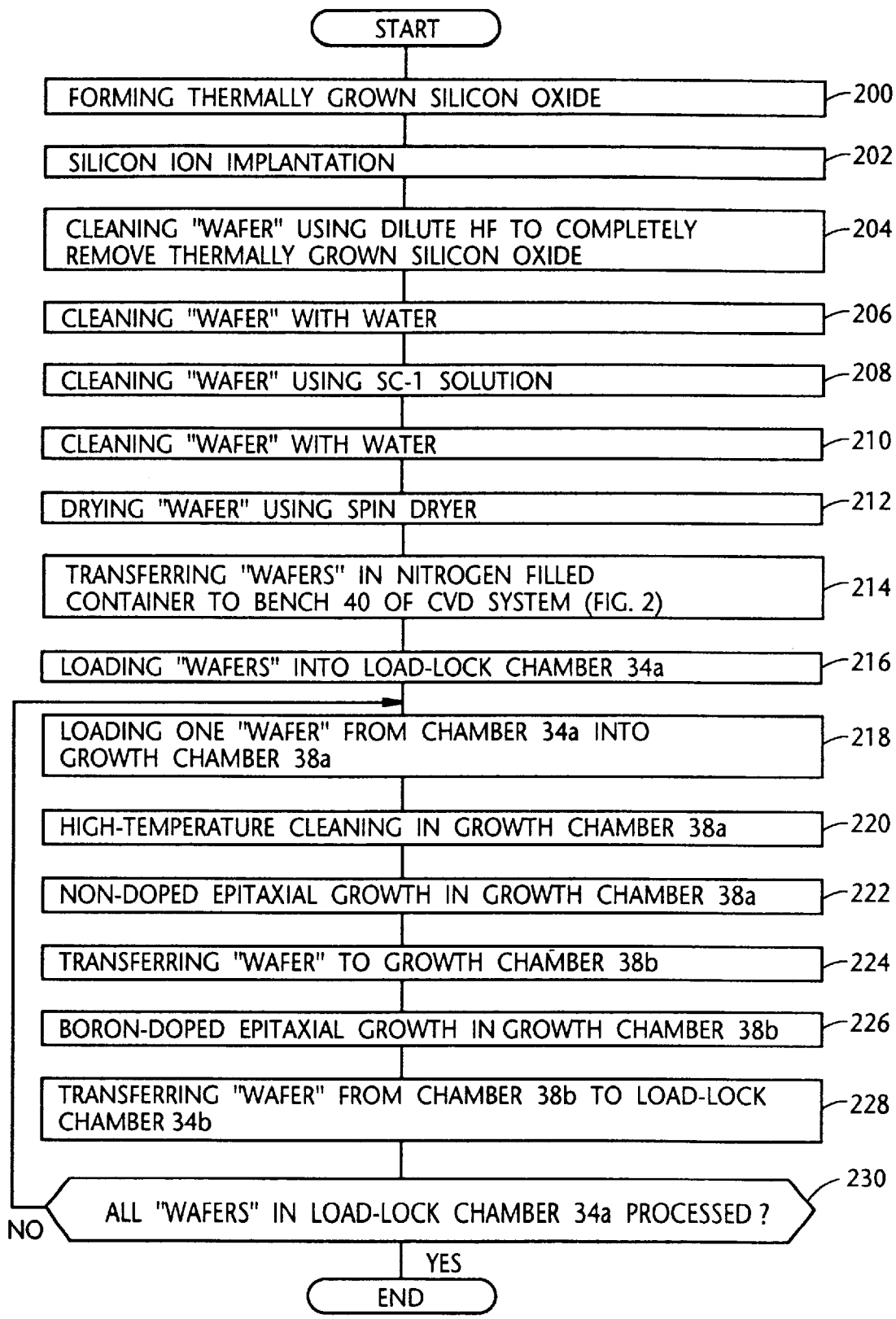
FIG. 7 is a flow chart which includes steps which characterize the second embodiment of the present invention.
Figure 8A:
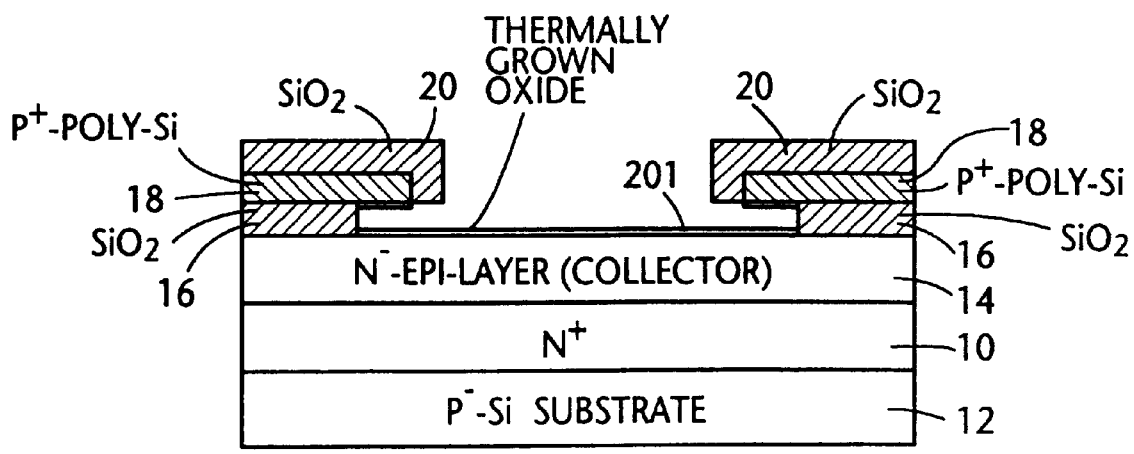
FIGS. 8(A) and 8(B) are diagrams which show thermally grown oxide on the substrate and a manner of ion implantation, respectively.
Figure 8B:
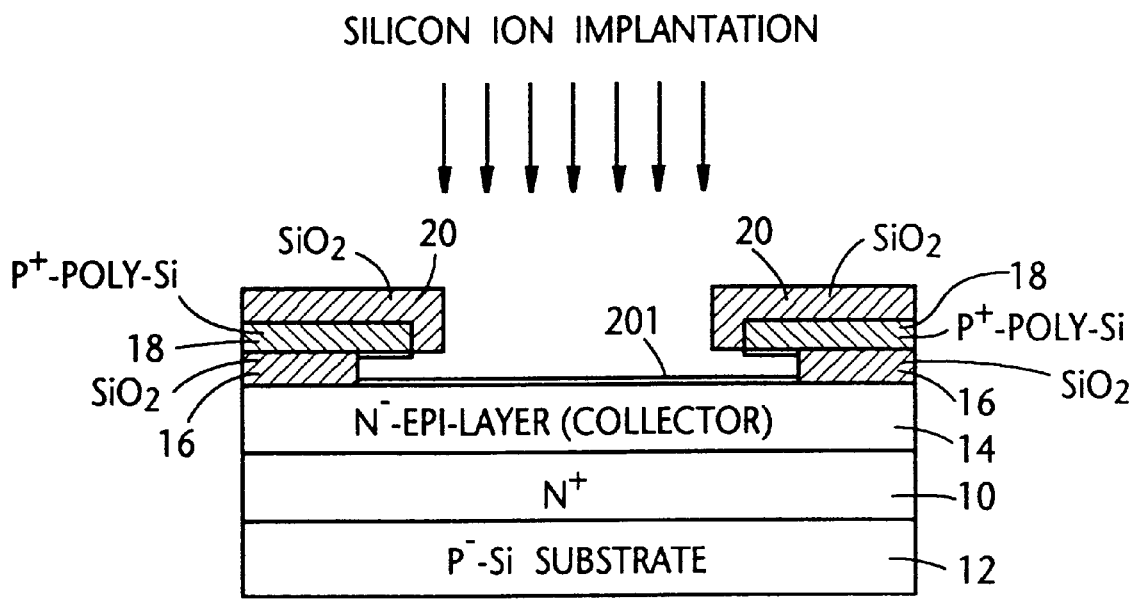

As shown in FIG. 7, at step 200, a thermally grown silicon oxide is formed on the substrate using a conventional process. This thermally grown oxide on the substrate is schematically illustrated by numeral 201 in FIG. 8(A), and has a thickness of about 200 angstroms (for example). At step 202, silicon ions are implanted at the conditions of 10 KeV and 1E13 atomes/$cm^2$ (for example). FIG. 8(B) shows schematically the manner of ion implantation. Further, at step 204, the wafer is cleaned using a dilute HF solution in order to completely remove the thermally grown oxide. Subsequently, the wafer is subjected to cleaning with water (step 206), cleaning using the SC-1 solution (step 208), cleaning with water (step 210), and drying using a spin dryer (212), all of which correspond to steps 82, 84, 86, and 88 of FIG. 4. However, as mentioned above, the clean work station 110 of FIGS. 5(A) and 5(B) is not used in the second embodiment. That is, the aforesaid steps of FIG. 7 are implemented in the clean room environment. Thereafter, at step 214, the pretreated wafers are accommodated in a wafer carry box filled with nitrogen and then transferred to the clean bench 40 of the robotic transfer section 32 (FIG. 2). It is to be noted that the above mentioned wafer carry box, which is filled with nitrogen, is not shown in FIG. 2 but corresponds to the box 46a. The silicon wafers in the box 46a are then successively loaded into the load-lock chamber 34a (step 216). The following steps 218, 220, 222, 224, 226, 228, and 230 are respectively identical with the steps 94, 96, 98, 100, 102, 104, and 106 of FIG. 4, and accordingly, further description thereof will not be given for simplifying the instant disclosure.

In the above, the process of growing thermal oxide at step 200 may be omitted, in the case of which step 204 is also omitted.

According to the second embodiment, at step 208, native oxide is formed on the substrate while cleaning the wafer using the SC-1 solution. However, boron introduced into native oxide or adhered to the surface thereof during the process at step 208 is diffused in an accelerated manner into the substrate while the wafer is subjected to the high-temperature flashing at step 220. This is because large quantities of interstitial Si atoms are produced during the silicon implantation. Further, the implant damage is removed at steps 208 and 220. For further details of the aforesaid boron diffusion into the silicon substrate, reference should be made to, for example, a paper entitled "Trap-limited interstitial diffusion and enhanced boron clustering in silicon" by P. A. Stolk, et al., Appl. Phys. Lett. 66(5), Jan. 30, 1995, pages 568, 570.

Figure 13:
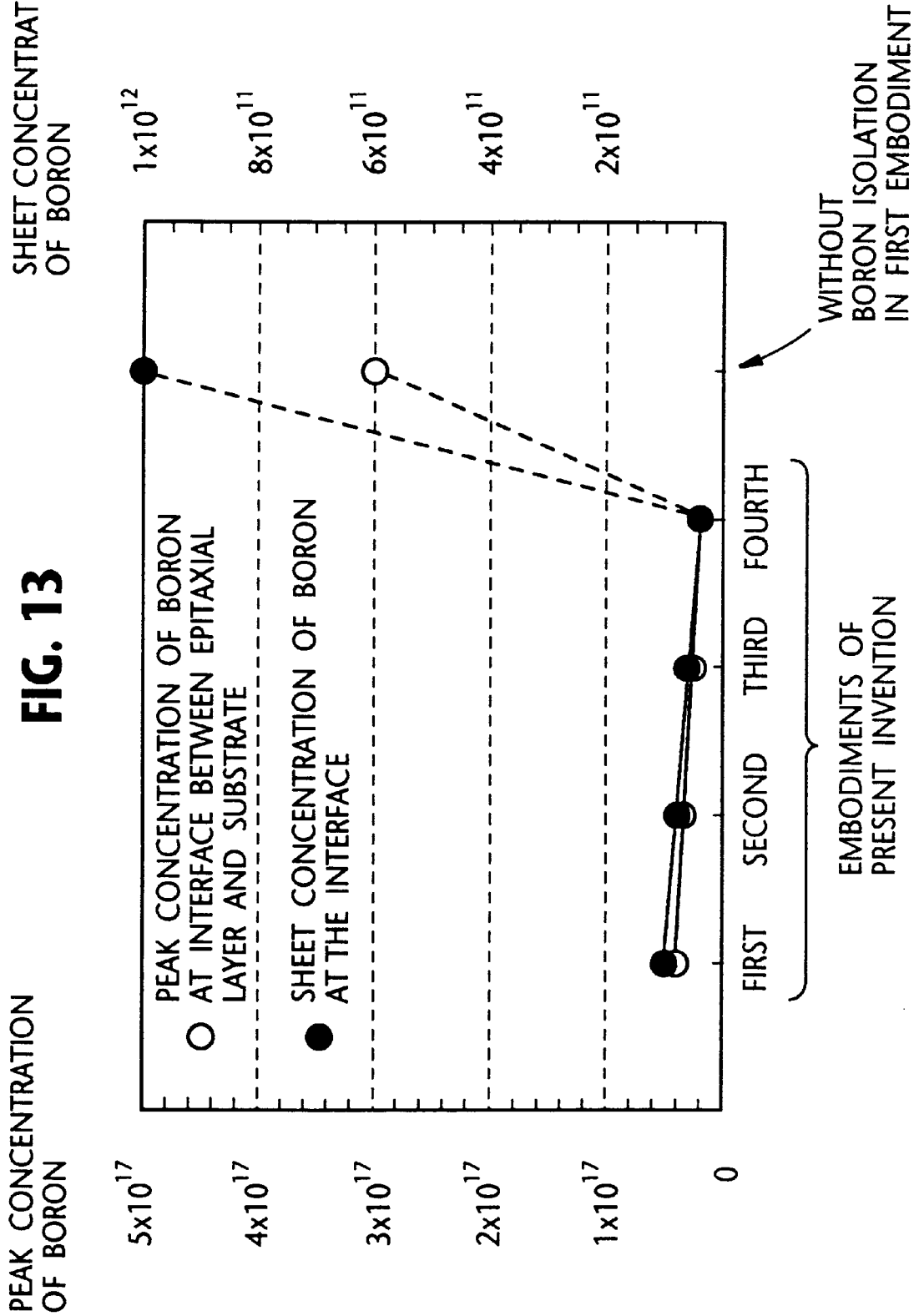
FIG. 13 is a graph which shows the experiments results of the first to fourth embodiments together with the prior art.

In connection with the second embodiment, according to experiments conducted by the inventors under the conditions as mentioned above, the peak concentration of boron at an interface between the epitaxial layer and the substrate was 3.5E16 atoms/$cm^3$. On the other hand, the sheet concentration of boron at the same interface was 8E10 atoms/$cm^2$. These results were obtained using the above-mentioned secondary-ion mass spectroscopic (SIMS) technique and are also shown in FIG. 13.

Figure 9B:
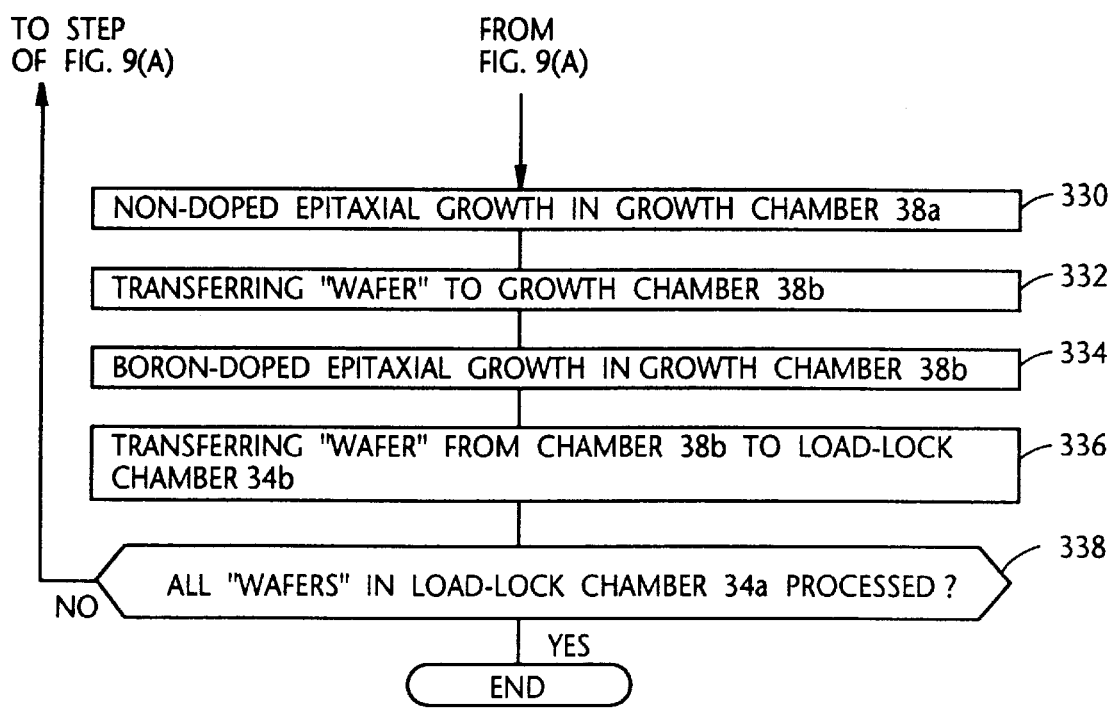

A third embodiment of the present invention will be described with reference to FIGS. 2, 9(A) and 9(B). In the third embodiment, the boron isolating means such as the clean work station 110 of FIGS. 5(A) and 5(B) is not used.

As in the first embodiment, it is assumed that the silicon substrates (or wafers), on each of which the layers shown in FIG. 1(A) has already been formed, are pretreated and then transferred to an UHV-CVD apparatus (or system) 30 shown in FIG. 2.

As shown in FIG. 9(A), at step 300, the wafer is cleaned using a dilute HF solution for removing native oxide on the substrate. Subsequently, the wafer is subjected to cleaning with water (step 302), cleaning using the SC-1 solution (step 304), and cleaning with water (step 306), all of which correspond to steps 82, 84, 86, and 88 of FIG. 4. However, as mentioned above, the clean work station 110 of FIGS. 5(A) and 5(B) it not used in the third embodiment. That is, the above steps of FIG. 9(A) are implemented in the clean room environment.

Thereafter, at step 308, the wafer is again cleaned using dilute HF to remove native oxide on the wafer, which is produced in step 304, after which at step 310 the wafer is washed with water to remove the chemicals used in the previous step 308. Following this, at step 312, the wafer is immersed (or cleaned) in boiling or hot concentrated HNO$_3$ (nitric acid) in order to again develop native oxide (about 15 angstrom in thick) on the substrate. Thereafter, the wafer is cleaned with water (step 314), after which, at step 318, the thickness of the native oxide is reduced to about 5 angstroms using dilute HF≦about 1%. At step 320, the wafer is dried using a spin dryer. The following steps 322 to 338 are respectively identical with the corresponding steps 214 to 230, and accordingly, further description hereof will not be given for simplifying the instant disclosure.

Since nitric acid contains no boron, the native oxide grown at step 312 contains very little boron compared to the native oxide produced when a wafer is cleaned using the SC-1 solution at step 304. Further, the thickness of the native oxide produced at step 312 is reduced and thus, only a thin native oxide layer containing almost no boron remains on the substrate and is removed in the high-temperature flashing in step 328 as in the previous embodiments.

In the above, however, if the thickness of the native oxide can be controlled such as to be sufficiently small as referred to in connection with step 316, the operation at step 316 can be omitted.

In connection with the third embodiment, according to the experiment conducted by the inventors under the conditions as mentioned above, the peak concentration of boron at an interface between the epitaxial layer and the substrate was 3.0E16 atoms/cm$^3$. On the other hand, the sheet concentration of boron at the same interface was 6E10 atoms/cm$^3$. These results were obtained using the above-mentioned secondary-ion mass spectroscopic (SIMS) technique and are plotted in FIG. 13.

A fourth embodiment of the present invention will be described with reference to FIGS. 2 and 10. In the fourth embodiment, the boron isolating means such as the clean work station 110 of FIGS. 5(A) and 5(B) is not used.

As in the first embodiment, it is assumed that the silicon substrates (or wafers), on each of which the layers shown in FIG. 1(A) has already been formed, are pretreated and then transferred to an UHV-CVD apparatus (or system) 30 shown in FIG. 2.

Steps 400 to 410 in FIG. 10 are respectively identical with steps 300 to 310 of FIG. 9(A) and accordingly, these steps will not been described for the sake of brevity. At step 412, the wafer is dried using a spin dryer. Thereafter, at step 414, silicon oxide is thermally grown on the substrate using an oxygen gas in a low-pressure environment. The subsequent steps 416 to 432 are respectively identical to steps 322 to 338 of FIG. 9(A) and thus, further description thereof will be omitted for simplifying the instant disclosure.

In the above, the thermal oxide growth is implemented at less than 20 torr in a CVD growth chamber. In this case, the temperature of the substrate is equal to or less than 900° C. Further, the thermally grown oxide has a thickness of being equal to or less than 30 angstrom.

The thermally grown oxide on the substrate under a reduced pressure environment contains almost no boron. Further, such an oxide is highly compacted in structure (viz., compact substance) compared with native oxide grown on the substrate due to the cleaning using the SC-1 solution and thus, it is difficult that boron in the clean room adheres to the oxide grown in step 414.

In connection with the fourth embodiment, the inventors conducted experiments under the process conditions wherein (a) the thermal oxide growth was implemented at 10 torr in a CVD growth chamber, (b) the temperature of the substrate was kept at 900° C., and (c) the thermally grown oxide has a thickness of 20 angstrom. Further, the conditions of the CVD apparatus were set as mentioned in the first embodiment. The experiment results showed that the peak concentration of boron at an interface between the epitaxial layer and the substrate was 2.5E16 atoms/cm$^3$. On the other hand, the sheet concentration of boron at the same interface was 5E10 atoms/cm$^2$. As in the previous embodiments, these results were obtained using the above-mentioned secondary-ion mass spectroscopic (SIMS) technique and are plotted in FIG. 13.

Figure 12:
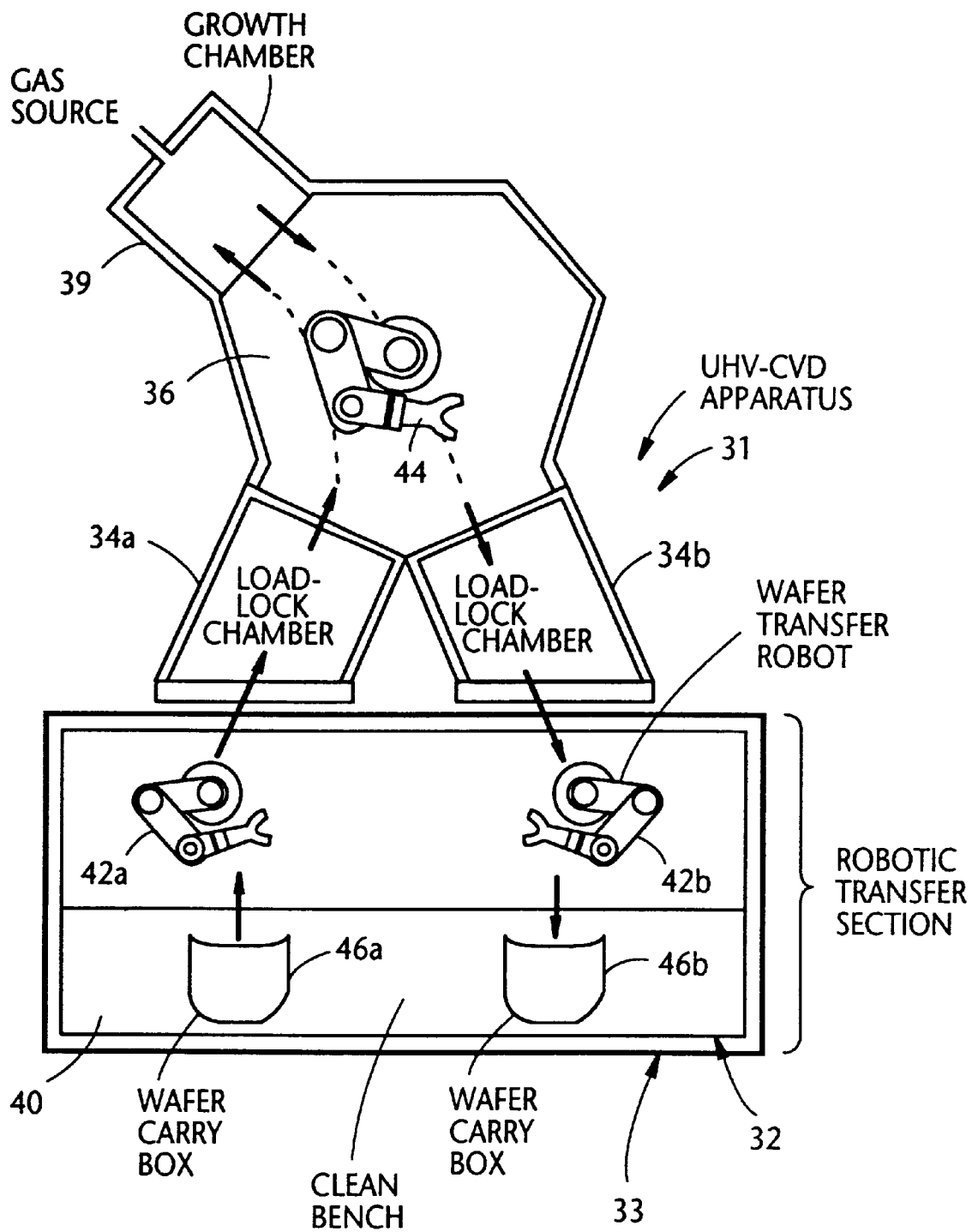
FIG. 12 is a diagram showing an UHV-CVD used with the fifth embodiment.

Finally, a fifth embodiment of the present invention will be described with reference to FIGS. 11 and 12. In the fifth embodiment, the boron isolating means such as the clean work station 110 of FIGS. 5(A) and 5(B) is used as in the first embodiment. As shown in FIG. 12, the fifth embodiment uses only one growth chamber (denoted by numeral 39).

It is assumed that the silicon substrates (or wafers), on each of which the layers shown in FIG. 1(A) has already been formed, are pretreated and then transferred to an UHV-CVD apparatus (or system) 31 shown in FIG. 12.

In FIG. 11, steps 500 to 512 are respectively identical with steps 80 to 92 and accordingly, they will not been described for the sake of brevity. At step 514, the temperature of the wafer is raised to 700° C., after which the growth chamber 39 is cleaned while flowing an F$_2$ gas (flow rate is 20 sccm) for about 5 minutes. Accordingly, boron residues (solid) on the inner wall of the growth chamber 39 are vaporized as shown below.

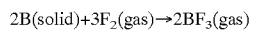

The 2BF$_3$ gas is evacuated outside the chamber 39. After cleaning the growth chamber 39, a first wafer is loaded into the chamber 39 from the load-lock chamber 34a at step 516. The wafer is then subjected to a high-temperature flashing in order to remove native oxide formed thereon at step 518. Thereafter, at step 520, a non-doped epitaxial growth (2000 angstrom (for example)) on the wafer is implemented in the chamber 39. Subsequently, at the same chamber 39, a boron-doped epitaxial grown (2000 angstrom (for example)) is carried out on the non-doped layer while flowing Si$_2$H$_6$ and (H$_2$ (1%)+B$_2$H$_6$ (99%)) both at a flow rate of 10 sccm. When the non- and boron-doped expitaxial growths are completed, the wafer is transferred to the load-lock chamber 34b (step 522). The flow goes back to step 514 whereat the next wafer is subjected to the above mentioned processes at steps 514 to 522. At step 524, a check is made to determine if all the wafers stored in the load-lock chamber 34a have been processed. If the answer is positive (viz., YES), the routine is terminated.

In connection with the fifth embodiment, the inventors conducted an experiment under the aforesaid conditions. Although not shown in FIG. 13, the experiment results showed that the peak concentration of boron at an interface between the expitaxial layer and the substrate was 4E16 atoms/cm$^3$. On the other hand, the sheet concentration of boron at the same interface was 1E11 atoms/cm$^2$. As in the previous embodiments, these results were obtained using the above-mentioned secondary-ion mass spectroscopic (SIMS) technique.

It will be understood that the above disclosure is representative of five possible embodiments of the present invention and the concept on which the invention is based is not specifically limited thereto.

What is claimed is:

1. A method of reducing boron concentration between a silicon substrate and one of an Si or $Si_{1-x}Ge_x$ layer which is epitaxially grown in a CVD (chemical vapor deposition) apparatus, comprising the steps of:
   (a) cleaning the substrate using a two step cleaning process with chemicals each of which contains boron at a concentration of less than 50 ppt, said cleaning being implemented before the substrate is loaded into the CVD apparatus; and
   (b) processing the substrate in a boron-free isolated environment at step (a) and before the substrate is loaded into the CVD apparatus.

2. The method of reducing boron concentration as claimed in claim 1, wherein said processing of the substrate step (a) further includes washing the substrate with water, drying the substrate, transferring the substrate to the CVD apparatus, and loading the substrate into the CVD apparatus.

3. The method of reducing boron concentration as claimed in claim 2, wherein said transferring of the substrate to the CVD apparatus is implemented using a substrate carry box filled with one of nitrogen or an inert gas.

4. The method of reducing boron concentration as claimed in claim 1, wherein said boron-free isolated environment is provided in a clean room which removes boron resulting from a glass filter.

5. The method of reducing boron concentration as claimed in claim 4, wherein said transferring of the substrate to the CVD apparatus is implemented using a substrate carry box filled with one of nitrogen or an inert gas.

6. The method of reducing boron concentration as claimed in claim 1, wherein the solution for cleaning the substrate at step (a) comprises $NH_4OH$—$H_2O_2$—$H_2O$.

7. A method of reducing boron concentration between a silicon substrate and one of an Si or $Si_{1-x}Ge_x$ layer which is epitaxially grown in a CVD (chemical vapor deposition) apparatus, comprising the steps of:
   (a) ion implanting silicon ions into the substrate before the substrate is loaded into the CVD apparatus;
   (b) cleaning the substrate using a cleaning solution which includes $H_2O_2$ before the substrate is loaded into the CVD apparatus;
   (c) implementing a high temperature treatment on the substrate in the CVD apparatus thereby diffusing boron, adhered to the substrate, into the substrate.

8. The method of reducing boron concentration as claimed in claim 7, wherein said high-temperature treatment in step (c) removes oxide, produced on the substrate in an ambient clean room atmosphere, during the cleaning of the substrate.

9. The method of reducing boron concentration as claimed in claim 7, further comprising the steps of:
   (d) thermally growing an oxide on the substrate before step (a); and
   (e) completely removing the thermally grown oxide between steps (a) and (b), using a wet chemical etch technique.

10. The method of reducing boron concentration as claimed in claim 7, wherein the solution used at step (b) comprises $NH_4OH$—$H_2O_2$—$H_2O$.

11. The method of reducing boron concentration as claimed in claim 7, wherein the substrate is transferred to the CVD apparatus using a substrate carry box filled with one nitrogen or an inert gas.

12. A method of reducing boron concentration between a silicon substrate and an Si or $Si_{1-x}Ge_x$ layer which is epitaxially grown in a CVD (chemical vapor deposition) apparatus, comprising the steps of:
   (a) cleaning the substrate using a solution including $H_2O_2$ before the substrate is loaded into the CVD apparatus;
   (b) removing native oxide produced on the substrate at step (a) using a dilute HF before the substrate is loaded into the CVD apparatus;
   (c) immersing the substrate in boiling concentrated $HNO_3$ to form native oxide on the substrate, the immersing of the substrate being implemented before the substrate is loaded into the CVD apparatus; and
   (d) implementing a high-temperature treatment on the substrate in the CVD apparatus to diffuse boron, adhered to the substrate, into the substrate.

13. A method as claimed in claim 12, further comprising the step of:
   (e) reducing the thickness of the native oxide, produced in step (c), using a dilute HF to a predetermined value before the substrate is loaded into the CVD apparatus, the dilute HF used in step (e) having concentration lower than the dilute HF used at step (b).

14. A method as claimed in claim 12, wherein the substrate is transferred to the CVD apparatus using a substrate carry box filled with nitrogen.

15. A method as claimed in claim 12, the solution used at step (a) is composed of $NH_4OH$—$H_2O_2$—$H_2O$—.

16. A method of reducing boron concentration between a silicon substrate and an Si or $Si_{1-x}Ge_x$ layer which is epitaxially grown in a CVD (chemical vapor deposition) apparatus, comprising the steps of:
   (a) cleaning the substrate using a solution including $H_2O_2$ before the substrate is loaded into the CVD apparatus;
   (b) removing native oxide produced on the substrate at step (a) using a dilute HF before the substrate is loaded into the CVD apparatus;
   (c) growing thermally oxide on the substrate using an oxygen gas in a low-pressure atmosphere before the substrate is loaded into the CVD apparatus; and
   (d) implementing a high-temperature treatment on the substrate in he CVD apparatus to remove the oxide which has thermally been grown on the substrate at step (c).

17. A method as claimed in claim 16, wherein the thermal oxide growth at step (c) is implemented at less than 20 torr in a CVD growth chamber with the temperature of the substrate being equal to or less than 900° C., and wherein the thermal oxide grown at step (c) has a thickness of being equal to or less than 30 angstrom.

18. A method as recited in claim 16, wherein the substrate is transferred to the CVD apparatus using a substrate carry box filled with nitrogen.

19. A method as recited in claim 16, the solution used at step (a) is composed of $NH_4OH—H_2O_2—H_2O—$.

20. A method of reducing boron concentration between a silicon substrate and an Si or $Si_{1-x}Ge_x$ layer which is epitaxially grown in a CVD (chemical vapor deposition) apparatus, comprising the steps of:
  (a) cleaning a CVD growth chamber, before the substrate is loaded into the growth chamber, using an $F_2$ gas at a predetermined temperature of the substrate, thereby to remove boron residues in the growth chamber;
  (b) implementing a high-temperature treatment on the usbstrate loaded into the growth chamber to remove native oxide on the substrate;
  (c) implementing sequentially non-doped and boron-doped epitaxial growths on the substrate in the growth chamber;
  (d) cleaning the substrate using a solution which contains boron whose concentration is less than 50 ppt, said cleaning being implemented before the silicon substrate is loaded into the CVD apparatus; and
  (e) processing the substrate in a boron-free isolated environment at step (d) and before the substrate is loaded into the CVD apparatus,
  wherein the solution used at step (d) comprises $NH_4OH—H_2O_2—H_2O$.

21. A method as claimed in claim 20, wherein said processing of the substrate at step (e) further includes washing the substrate with water, drying the substrate, transferring the substrate to the CVD apparatus, and loading the substrate into the CVD apparatus.

22. A method as claim in claim 21, wherein said transferring of the substrate to the CVD apparatus is implemented using a substrate carry box filled with nitrogen.

23. A method as claimed in claim 20, wherein said boron-free isolated environment is provided in a clean room wherein boron resulting from a glass fiber filter is contained.

24. A method as claimed in claim 23, wherein said transferring of the substrate to the CVD apparatus is implemented using a substrate carry box filled with nitrogen.

* * * * *